United States Patent
Chen

(10) Patent No.: US 11,101,822 B1
(45) Date of Patent: Aug. 24, 2021

(54) DATA WRITING METHOD, MEMORY CONTROL CIRCUIT UNIT AND MEMORY STORAGE APPARATUS

(71) Applicant: PHISON ELECTRONICS CORP., Miaoli (TW)

(72) Inventor: Ping-Cheng Chen, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/993,249

(22) Filed: Aug. 13, 2020

(30) Foreign Application Priority Data

Aug. 3, 2020 (TW) .................................. 109126150

(51) Int. Cl.
*H03M 13/29* (2006.01)
*G06F 11/10* (2006.01)

(52) U.S. Cl.
CPC ..... *H03M 13/2906* (2013.01); *G06F 11/1068* (2013.01)

(58) Field of Classification Search
CPC ........................ H03M 13/2906; G06F 11/1068
See application file for complete search history.

(56) References Cited

U.S. PATENT DOCUMENTS

| | | | |
|---|---|---|---|
| 6,396,742 B1* | 5/2002 | Korsh | G11C 11/56 365/185.03 |
| 2006/0117214 A1* | 6/2006 | Sugiura | G11C 29/52 714/5.11 |
| 2010/0146224 A1* | 6/2010 | Mishima | G06F 11/2221 711/154 |
| 2014/0337681 A1* | 11/2014 | Liang | G06F 11/1044 714/755 |
| 2018/0335942 A1* | 11/2018 | Yeh | G06F 3/0679 |
| 2020/0089608 A1* | 3/2020 | Chou | G06F 12/0246 |

* cited by examiner

*Primary Examiner* — Guy J Lamarre
(74) *Attorney, Agent, or Firm* — JCIPRNET

(57) ABSTRACT

A data writing method, a memory control circuit unit and a memory storage apparatus are provided. The method includes: receiving first data and second data from a host system; generating a first array error correcting code based on the first data, and generating a second array error correcting code based on the second data; programming a first group including the first array error correcting code into a first chip enable group by using a first programming mode; and programming a second group including the second array error correcting code into a second chip enable group by using a second programming mode.

27 Claims, 10 Drawing Sheets

|  | PL(1) | PL(2) | PL(3) | PL(4) | PL(5) | PL(6) | PL(7) | PL(8) |
|---|---|---|---|---|---|---|---|---|
| 701(0)~708(0) | Data 810(1) | Data 810(2) | Data 810(3) | Data 810(4) | Data 810(5) | Data 810(6) | Data 810(7) | Data 810(8) |
| 701(1)~708(1) | Data 810(9) | Data 810(10) | Data 810(11) | Data 810(12) | Data 810(13) | Data 810(14) | Data 810(15) | Data 810(16) |
| 701(2)~708(2) | Data 820(1) | Data 820(2) | Data 820(3) | Data 820(4) | Data 820(5) | Data 820(6) | Data 820(7) | Data 820(8) |
| 701(3)~708(3) | Data 820(9) | Data 820(10) | Data 820(11) | Data 820(12) | Data 820(13) | Data 820(14) | Data 820(15) | Data 820(16) |
| 701(4)~708(4) | ECC 811 | ECC 812 | Data 830(1) | Data 830(2) | Data 830(3) | Data 830(4) | Data 830(5) | Data 830(6) |
| 701(5)~708(5) | Data 830(7) | Data 830(8) | Data 830(9) | Data 830(10) | Data 830(11) | Data 830(12) | Data 830(13) | Data 830(14) |
| 701(6)~708(6) | Data 830(15) | Data 830(16) | Data 840(1) | Data 840(2) | Data 840(3) | Data 840(4) | Data 840(5) | Data 840(6) |
| 701(7)~708(7) | Data 840(7) | Data 840(8) | Data 840(9) | Data 840(10) | Data 840(11) | Data 840(12) | Data 840(13) | Data 840(14) |
| 701(8)~708(8) | Data 840(15) | Data 840(16) | ECC 821 | ECC 822 |  |  |  |  |
|  | ... | ... | ... | ... | ... | ... | ... | ... |

FIG. 8

| PL(1) | PL(2) | PL(3) | PL(4) | PL(5) | PL(6) | PL(7) | PL(8) | ... | PL(N) |
|---|---|---|---|---|---|---|---|---|---|
| Data 810(1) | Data 810(2) | Data 810(3) | Data 810(4) | Data 810(5) | Data 810(6) | Data 810(7) | Data 810(8) | ... | ECC 811 |
| Data 810(9) | Data 810(10) | Data 810(11) | Data 810(12) | Data 810(13) | Data 810(14) | Data 810(15) | Data 810(16) | ... | ECC 812 |
| Data 820(1) | Data 820(2) | Data 820(3) | Data 820(4) | Data 820(5) | Data 820(6) | Data 820(7) | Data 820(8) | ... | ECC 821 |
| Data 820(9) | Data 820(10) | Data 820(11) | Data 820(12) | Data 820(13) | Data 820(14) | Data 820(15) | Data 820(16) | ... | ECC 822 |
| ... | ... | ... | ... | ECC 831 | ECC 832 | ECC 841 | ECC 842 | ... | ... |

| | PL(1) | PL(2) | PL(3) | PL(4) | PL(5) | PL(6) | PL(7) | PL(8) |
|---|---|---|---|---|---|---|---|---|
| 701(0)~708(0) | Data 810(1) | Data 810(2) | Data 810(3) | Data 810(4) | Data 810(5) | Data 810(6) | Data 810(7) | Data 810(8) |
| 701(1)~708(1) | Data 810(9) | Data 810(10) | Data 810(11) | Data 810(12) | Data 810(13) | Data 810(14) | Data 810(15) | Data 810(16) |
| 701(2)~708(2) | Data 810(17) | Data 810(18) | Data 810(19) | Data 810(20) | Data 810(21) | Data 810(22) | Data 810(23) | Data 810(24) |
| 701(3)~708(3) | Data 810(25) | Data 810(26) | Data 810(27) | Data 810(28) | Data 810(29) | Data 810(30) | Data 810(31) | Data 810(32) |
| 701(4)~708(4) | ECC 810 | Data 820(7) | Data 820(6) | Data 820(5) | Data 820(4) | Data 820(3) | Data 820(2) | Data 820(1) |
| 701(5)~708(5) | Data 820(15) | Data 820(14) | Data 820(13) | Data 820(12) | Data 820(11) | Data 820(10) | Data 820(9) | Data 820(8) |
| 701(6)~708(6) | Data 820(23) | Data 820(22) | Data 820(21) | Data 820(20) | Data 820(19) | Data 820(18) | Data 820(17) | Data 820(16) |
| 701(7)~708(7) | Data 820(31) | Data 820(30) | Data 820(29) | Data 820(28) | Data 820(27) | Data 820(26) | Data 820(25) | Data 820(24) |
| 701(8)~708(8) | ... | ... | ... | ... | ... | ... | ECC 820 | Data 820(32) |
| | ... | ... | | | | | ... | ... |

FIG. 10

DATA WRITING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 109126150, filed on Aug. 3, 2020. The entirety of the above-mentioned patent application is hereby incorporated by reference herein and made a part of this specification.

BACKGROUND

1. Technology Field

The invention relates to a data writing method, and more particularly, to a data writing method for a rewritable non-volatile memory module, and a memory control circuit unit and a memory storage apparatus using the method.

2. Description of Related Art

The growth of digital cameras, mobile phones, and MP3 players has been rapid in recent years. Consequently, the consumers' demand for storage media has increased tremendously. The characteristics of data non-volatility, low power consumption, compact size and fast read/write speed make a rewritable non-volatile memory module (e.g., flash memory) ideal to be built in the portable multi-media devices cited above.

In general, to ensure data security, data stored in the rewritable non-volatile memory module is encoded to generate an error correcting code. If an error occurs in the data, this error correcting code can be used to correct the error. As one approach for that, the rewritable non-volatile memory module includes multiple memory chips, and one of memory chips is used to store error correcting codes while the other memory chips can be used to store data. In this way, when one of the memory chips storing data is damaged, other data and error correcting codes can be used to restore the damaged data. However, when reading data, if the data is not damaged, there is no need to read the error correcting code, or else loading of the memory chips will be different when reading the data, resulting in an inefficient data reading. Therefore, how to increase the use efficiency of memory space and improve the efficiency of data reading is a topic of concern to those skilled in the art.

SUMMARY

The invention provides a data writing method, a memory control circuit unit and a memory storage apparatus, which can improve a data reading efficiency by evenly distributing array error correcting codes.

An exemplary embodiment of the invention provides a data writing method for a rewritable non-volatile memory module. The rewritable non-volatile memory module includes a plurality of management units. Each of the plurality of management units includes a plurality of chip enable groups. Each of the plurality of chip enable groups includes a plurality of planes. Each of the plurality of planes includes a plurality of physical programming units. The plurality of chip enable groups include a first chip enable group and a second chip enable group. The data writing method includes: receiving first data and second data from a host system; generating a first array error correcting code based on the first data, and generating a second array error correcting code based on the second data; programming a first group including the first array error correcting code into the first chip enable group by using a first programming mode; and programming a second group including the second array error correcting code into a second chip enable group by using a second programming mode. The second programming mode is different from the first programming mode, and the first array error correcting code and the second array error correcting code are configured to correct the plurality of physical programming units storing the first data and the second data, respectively.

In an exemplary embodiment of the invention, a data volume of the first data is different from a data volume of the second data, and quantities of the plurality of physical programming units correctable by the first array error correcting code and the second array error correcting code are different.

In an exemplary embodiment of the invention, the first array error correcting code is programmed into a first super physical programming unit based on a first programming sequence in the first programming mode, and the second array error correcting code is programmed into a second super physical programming unit based on a second programming sequence in the second programming mode. The first programming sequence is different from the second programming sequence.

In an exemplary embodiment of the invention, the first super physical programming unit has the physical programming units in which a first physical programming unit is a last physical programming unit programmed in the first super physical programming unit. The first super physical programming unit has the physical programming units in which a second physical programming unit is a last physical programming unit programmed in the second super physical programming unit, and a relative position of the first physical programming unit in the first super physical programming unit is different from a relative position of the second physical programming unit in the second super physical programming unit.

In an exemplary embodiment of the invention, a super physical erasing unit includes the first chip enable group and the second chip enable group. A number of groups of the first array error correcting code programmed into the first chip enable group is identical to a number of groups of the second array error correcting code programmed into the second chip enable group, and the super physical erasing unit is a minimum data erasing management unit.

In an exemplary embodiment of the invention, the first array error correcting code includes a first partial array error correcting code and a second partial array error correcting code.

In an exemplary embodiment of the invention, the method further includes: temporarily storing the first partial array error correcting code in a buffer memory; and after generating the second partial array error correcting code based on the first data, programming the first partial array error correcting code and the second partial array error correcting code respectively into the plurality of physical programming units of the different planes included by the first chip enable group.

In an exemplary embodiment of the invention, the first array error correcting code includes a first partial array error correcting code and a second partial array error correcting code. The first array error correcting code is configured to, when at least one of the physical programming units storing the first data generates an error, correct the physical programming unit that generates the error based on a parity correction algorithm. The second array error correcting code is configured to, when at least one of the physical programming units storing the second data generates the error, correct the physical programming unit that generates the error based on the parity correction algorithm.

In an exemplary embodiment of the invention, the method further includes: generating a redundant error correcting code based on the first data, the redundant error correcting code being configured to correct a single physical programming unit written with at least part of the first data. A number of bits correctable by the redundant error correcting code is less than a number of bits correctable by the first array error correcting code.

An exemplary embodiment of the invention provides a memory control circuit unit for a rewritable non-volatile memory module. The rewritable non-volatile memory module includes a plurality of management units. Each of the plurality of management units includes a plurality of chip enable groups. Each of the plurality of chip enable groups includes a plurality of planes. Each of the plurality of planes includes a plurality of physical programming units. The plurality of chip enable groups include a first chip enable group and a second chip enable group. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured to receive first data and second data. The memory management circuit is further configured to generate a first array error correcting code based on the first data, and generate a second array error correcting code based on the second data. The memory management circuit is further configured to program a first group including the first array error correcting code into the first chip enable group by using a first programming mode. Further, the memory management circuit is further configured to program a second group including the second array error correcting code into the second chip enable group by using a second programming mode, the second programming mode being different from the first programming mode. The first array error correcting code and the second array error correcting code are configured to correct the plurality of physical programming units storing the first data and the second data, respectively.

In an exemplary embodiment of the invention, quantities of the plurality of physical programming units correctable by the first array error correcting code and the second array error correcting code are different.

In an exemplary embodiment of the invention, the memory management circuit is further configured to program the first array error correcting code into a first super physical programming unit based on a first programming sequence in the first programming mode. The memory management circuit is further configured to program the second array error correcting code into a second super physical programming unit based on a second programming sequence in the second programming mode The first programming sequence is different from the second programming sequence.

In an exemplary embodiment of the invention, the first super physical programming unit has the physical programming units in which a first physical programming unit is a last physical programming unit programmed in the first super physical programming unit. The first super physical programming unit has the physical programming units in which a second physical programming unit is a last physical programming unit programmed in the second super physical programming unit, and a relative position of the first physical programming unit in the first super physical programming unit is different from a relative position of the second physical programming unit in the second super physical programming unit.

In an exemplary embodiment of the invention, a super physical erasing unit includes the first chip enable group and the second chip enable group. A number of groups of the first array error correcting code programmed into the first chip enable group is identical to a number of groups of the second array error correcting code programmed into the second chip enable group, and the super physical erasing unit is a minimum data erasing management unit.

In an exemplary embodiment of the invention, the first array error correcting code includes a first partial array error correcting code and a second partial array error correcting code.

In an exemplary embodiment of the invention, the memory management circuit is further configured to temporarily store the first partial array error correcting code in a buffer memory. After generating the second partial array error correcting code based on the first data, the memory management circuit is further configured to program the first partial array error correcting code and the second partial array error correcting code respectively into the plurality of physical programming units of the different planes included by the first chip enable group.

In an exemplary embodiment of the invention, the first array error correcting code includes a first partial array error correcting code and a second partial array error correcting code. The first array error correcting code is configured to, when at least one of the physical programming units storing the first data generates an error, correct the physical programming unit that generates the error based on a parity correction algorithm. The second array error correcting code is configured to, when at least one of the physical programming units storing the second data generates the error, correct the physical programming unit that generates the error based on the parity correction algorithm.

In an exemplary embodiment of the invention, the memory management circuit is further configured to generate a redundant error correcting code based on the first data, and the redundant error correcting code is configured to correct a single physical programming unit written with at least part of the first data. A number of bits correctable by the redundant error correcting code is less than a number of bits correctable by the first array error correcting code.

An exemplary embodiment of the invention provides a memory storage apparatus, which includes a connection interface unit, a rewritable non-volatile memory module and a memory control circuit unit. The connection interface unit is configured to couple to a host system. The rewritable non-volatile memory module includes a plurality of management units. Each of the plurality of management units includes a plurality of chip enable groups. Each of the plurality of chip enable groups includes a plurality of planes. Each of the plurality of planes includes a plurality of physical programming units. The plurality of chip enable groups include a first chip enable group and a second chip enable group. The memory control circuit unit is coupled to the connection interface unit and the rewritable non-volatile memory module. The memory control circuit unit is configured to receive first data and second data. The memory control circuit unit is further configured to generate a first array error correcting code based on the first data, and generate a second array error correcting code based on the second data. The memory control circuit unit is further configured to program a first group including the first array error correcting code into the first chip enable group by using a first programming mode. The memory control circuit unit is further configured to program a second group including the second array error correcting code into the second chip enable group by using a second programming mode, the second programming mode being different from the first programming mode. The first array error correcting code and the second array error correcting code are configured to correct the plurality of physical programming units storing the first data and the second data, respectively.

In an exemplary embodiment of the invention, quantities of the plurality of physical programming units correctable by the first array error correcting code and the second array error correcting code are different.

In an exemplary embodiment of the invention, the memory control circuit unit is further configured to program the first array error correcting code into a first super physical programming unit based on a first programming sequence in the first programming mode. The memory control circuit unit is further configured to program the second array error correcting code into a second super physical programming unit based on a second programming sequence in the second programming mode. The first programming sequence is different from the second programming sequence.

In an exemplary embodiment of the invention, the first super physical programming unit has the physical programming units in which a first physical programming unit is a last physical programming unit programmed in the first super physical programming unit. The first super physical programming unit has the physical programming units in which a second physical programming unit is a last physical programming unit programmed in the second super physical programming unit, and a relative position of the first physical programming unit in the first super physical programming unit is different from a relative position of the second physical programming unit in the second super physical programming unit.

In an exemplary embodiment of the invention, a super physical erasing unit includes the first chip enable group and the second chip enable group. A number of groups of the first array error correcting code programmed into the first chip enable group is identical to a number of groups of the second array error correcting code programmed into the second chip enable group, and the super physical erasing unit is a minimum data erasing management unit.

In an exemplary embodiment of the invention, the first array error correcting code includes a first partial array error correcting code and a second partial array error correcting code.

In an exemplary embodiment of the invention, the memory control circuit unit is further configured to temporarily store the first partial array error correcting code in a buffer memory. After generating the second partial array error correcting code based on the first data, the memory control circuit unit is further configured to program the first partial array error correcting code and the second partial array error correcting code respectively into the plurality of physical programming units of the different planes included by the first chip enable group.

In an exemplary embodiment of the invention, the first array error correcting code includes a first partial array error correcting code and a second partial array error correcting code. The first array error correcting code is configured to, when at least one of the physical programming units storing the first data generates an error, correct the physical programming unit that generates the error based on a parity correction algorithm. The second array error correcting code is configured to, when at least one of the physical programming units storing the second data generates the error, correct the physical programming unit that generates the error based on the parity correction algorithm.

In an exemplary embodiment of the invention, the memory control circuit unit is further configured to generate a redundant error correcting code based on the first data, and the redundant error correcting code is configured to correct a single physical programming unit written with at least part of the first data. A number of bits correctable by the redundant error correcting code is less than a number of bits correctable by the first array error correcting code.

Based on the above, the data writing method, the memory control circuit unit, and the memory storage apparatus proposed by the exemplary embodiments of the invention can be used to store the array error correcting codes into the different chip enables, so that the memory can read the data stored in the chip enables evenly when reading data. Accordingly, the invention can improve the data reading efficiency by evenly distributing the array error correcting codes among the chip enables. In addition, by further storing the array error correcting codes on the different planes of the same chip enable, the memory can reduce the chance of using the single plane method to read the data, and read the data stored in the chip enables evenly when reading data, thereby improving the data reading efficiency.

To make the aforementioned more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

FIG. 8 to FIG. 10 are schematic diagrams for writing an array error correcting code according to an exemplary embodiment of the invention.

DESCRIPTION OF THE EMBODIMENTS

Figure 1:
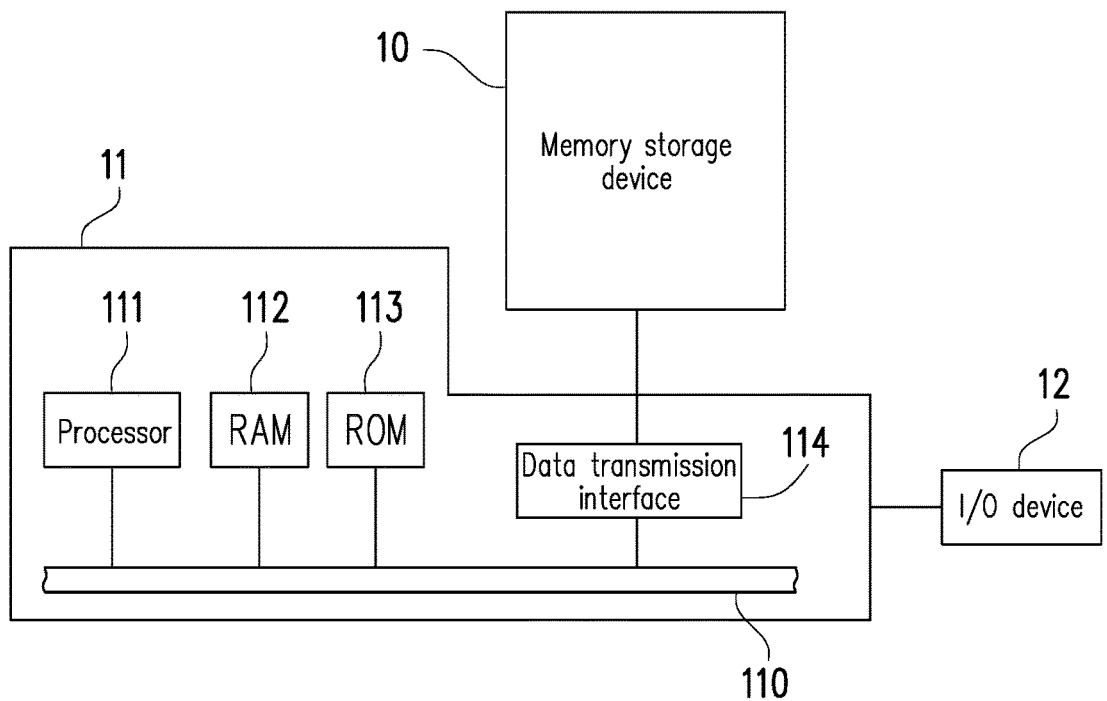
FIG. 1 is a schematic diagram illustrating a host system, a memory storage apparatus and an input/output (I/O) device according to an exemplary embodiment.

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage apparatus (a.k.a. a memory storage system) includes a rewritable non-volatile memory module and a controller (a.k.a. a control circuit unit). The memory storage apparatus is usually configured together with a host system so the host system can write data into the memory storage apparatus or read data from the memory storage apparatus.

Figure 2:
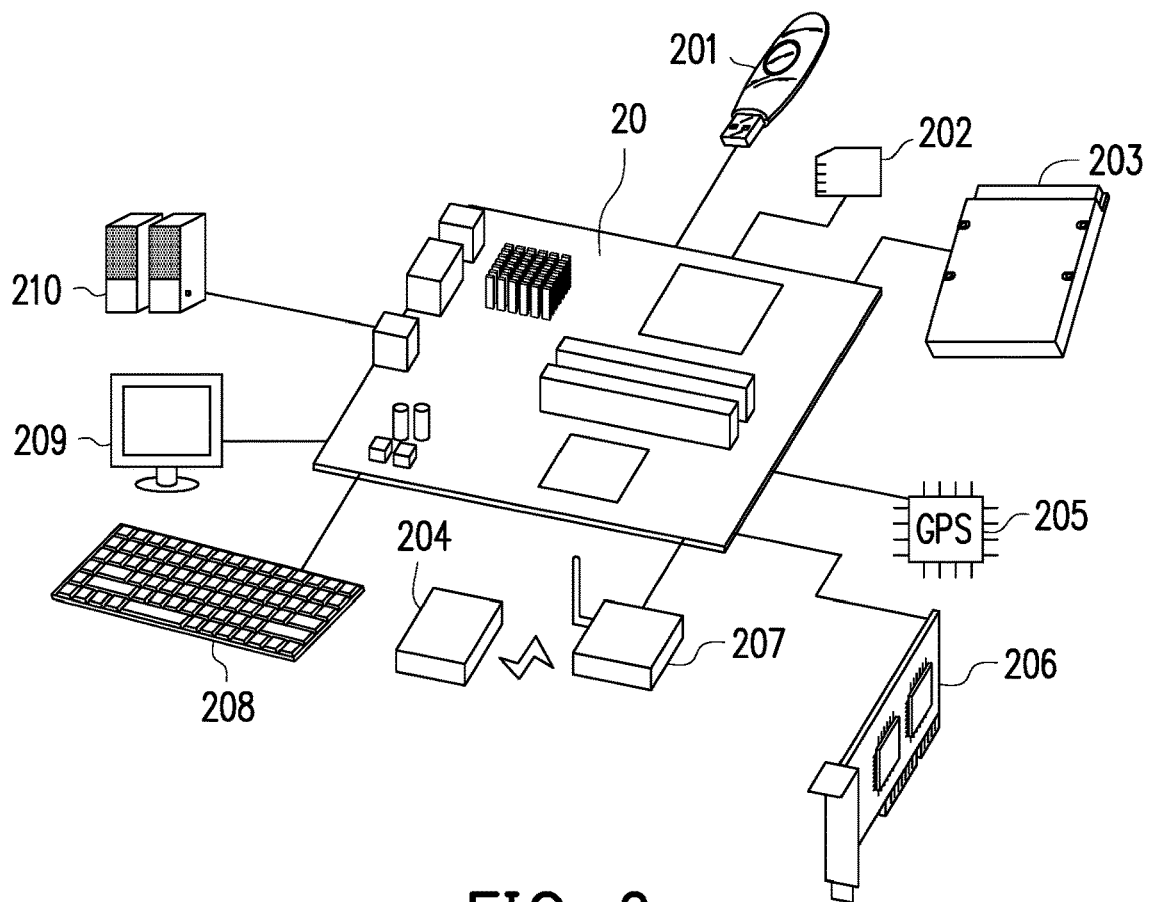
FIG. 2 is a schematic diagram illustrating a host system, a memory storage apparatus and an input/output (I/O) device according to another exemplary embodiment.

FIG. 1 is a schematic diagram illustrating a host system, a memory storage apparatus and an input/output (I/O) device according to an exemplary embodiment. FIG. 2 is a schematic diagram illustrating a host system, a memory storage apparatus and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage apparatus 10 through the data transmission interface 114. For example, the host system 11 can write data into the memory storage apparatus 10 or read data from the memory storage apparatus 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In this exemplary embodiment, the processor 111, the RAM 112, the ROM 113 and the data transmission interface 114 may be disposed on a main board 20 of the host system 11. The number of the data transmission interfaces 114 may be one or more. Through the data transmission interface 114, the main board 20 may be coupled to the memory storage apparatus 10 in a wired manner or a wireless manner. The memory storage apparatus 10 may be, for example, a flash drive 201, a memory card 202, a SSD (Solid State Drive) 203 or a wireless memory storage apparatus 204. The wireless memory storage apparatus 204 may be, for example, a memory storage apparatus based on various wireless communication technologies, such as a NFC (Near Field Communication) memory storage apparatus, a WiFi (Wireless Fidelity) memory storage apparatus, a Bluetooth memory storage apparatus, a BLE (Bluetooth low energy) memory storage apparatus (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage apparatus 204 via the wireless transmission device 207.

Figure 3:
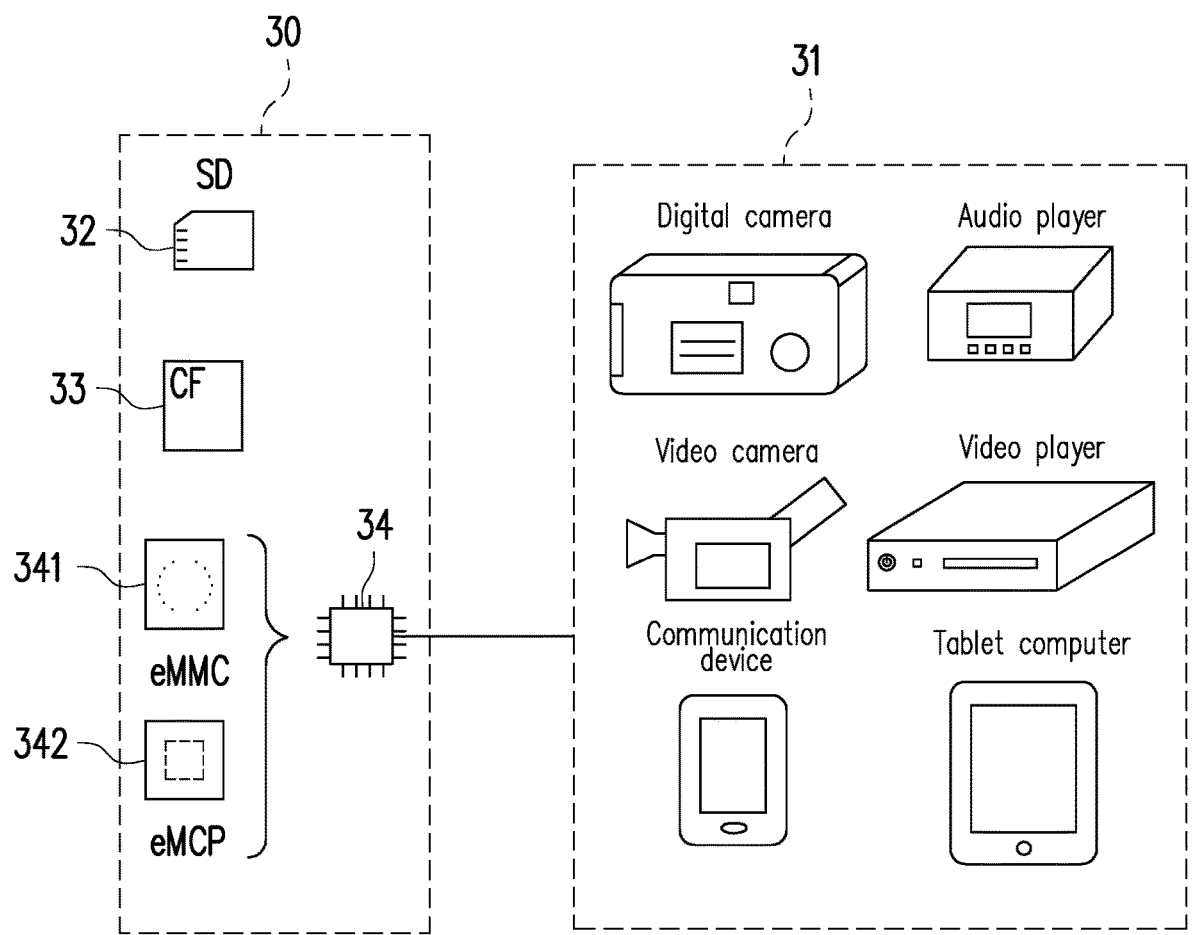
FIG. 3 is a schematic diagram illustrating a host system and a memory storage apparatus according to another exemplary embodiment.

In an exemplary embodiment, aforementioned host system may be any system capable of substantially cooperating with the memory storage apparatus for storing data. Although the host system is illustrated as a computer system in foregoing exemplary embodiment, nonetheless, FIG. 3 is a schematic diagram illustrating a host system and a memory storage apparatus according to another exemplary embodiment. Referring to FIG. 3, in another exemplary embodiment, a host system 31 may also be a system including a digital camera, a video camera, a communication device, an audio player, a video player or a tablet computer, whereas a memory storage apparatus 30 may be various non-volatile memory storage apparatuses used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
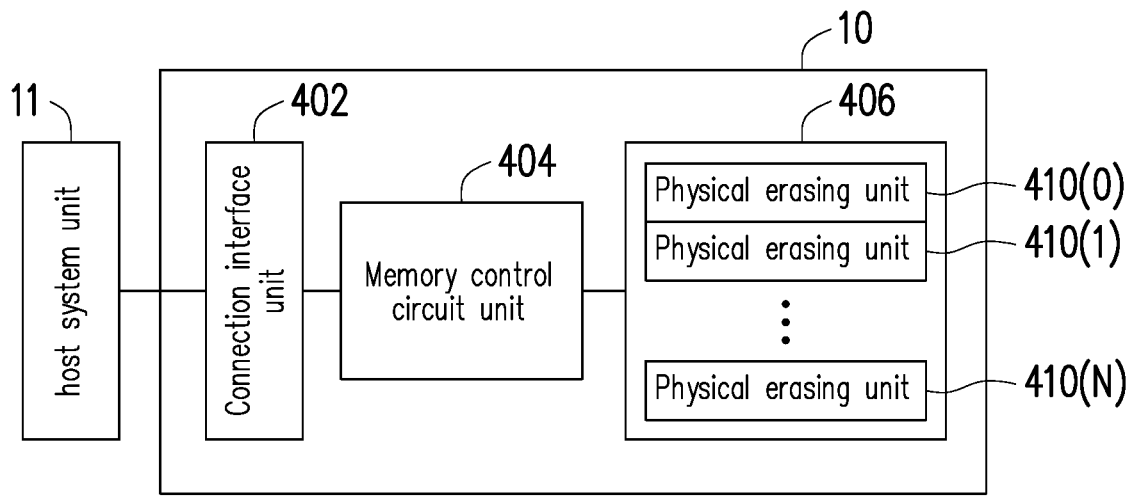
FIG. 4 is a schematic block diagram illustrating a host system and a memory storage apparatus according to an exemplary embodiment of the invention.

FIG. 4 is a schematic block diagram illustrating a host system and a memory storage apparatus according to an exemplary embodiment of the invention.

Referring to FIG. 4, the memory storage apparatus 10 includes a connection interface unit 402, a memory controlling circuit unit 404 and a rewritable non-volatile memory module 406.

In this exemplary embodiment, the connection interface unit 402 is compatible with a Secure Digital (SD) interface standard. Nevertheless, it should be understood that the invention is not limited in this regard. The connection interface unit 402 may also be compatible to a SATA (Serial Advanced Technology Attachment) standard, a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In this exemplary embodiment, the connection interface unit 402 and the memory control circuit unit 404 may be packaged into one chip, or the connection interface unit 402 is distributed outside of a chip containing the memory control circuit unit.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory storage module 406 includes multiple physical erasing units 410(0) to 410(N). For example, the physical erasing units 410(0) to 410(N) may belong to the same memory die or belong to different memory dies. Each physical erasing unit has multiple physical programming units, and the physical programming units of the same physical erasing unit may be written separately and erased simultaneously. Nevertheless, it should be understood that the invention is not limited in this regard. Each physical erasing unit may be composed of 64 physical programming units, 256 physical programming units or any number of the physical programming units.

More specifically, the physical erasing unit is a minimum unit for erasing. Namely, each physical erasing unit contains the least number of memory cells to be erased together. The physical programming unit is the minimum unit for programming. That is, the physical programming unit is the minimum unit for writing data. Each physical programming unit usually includes a data bit area and a redundant bit area. The data bit area containing multiple physical access addresses is used for storing user data, and the redundant bit area is used to store system data (e.g., management information such as control information and error checking and correcting code). In this exemplary embodiment, each data bit area of the physical programming unit contains 8 physical access addresses, and the size of each physical access address is 512 bytes. However, in other exemplary embodiments, the data bit area may also include more or less of the physical access addresses, and an amount and a size of the physical access addresses are not limited in the invention. For example, in an exemplary embodiment, the physical erasing unit is a physical block, and the physical programming unit is a physical page or a physical sector, but the invention is not limited thereto.

In this exemplary embodiment, the rewritable non-volatile memory module 406 is a SLC (Single Level Cell) NAND flash memory module (i.e., a flash memory module capable of storing one data bit in one memory cell). However, the invention is not limited in this regard. The rewritable non-volatile memory module 406 may also be a MLC (Multi Level Cell) NAND flash memory module (i.e., a flash memory module capable of storing two data bits in one memory cell), a TLC (Triple Level Cell) NAND flash memory module (i.e., a flash memory module capable of storing three data bits in one memory cell), or other memory modules having the same features. Specifically, the memory cells on the same word line may constitute one or more of the physical programming units. If each of the memory cells can store two or more bits, the physical programming units on the same word line may be at least classified into a lower physical programming unit and an upper physical programming unit. For example, a LSB (Least Significant Bit) of one memory cell belongs to the lower physical programming unit, and a MSB (most significant bit) of one memory cell belongs to the upper physical programming unit. In general, in the MLC NAND flash memory, a writing speed of the lower physical programming unit is higher than a writing speed of the upper physical programming unit, and/or a reliability of the lower physical programming unit is higher than a reliability of the upper physical programming unit.

Figure 5:
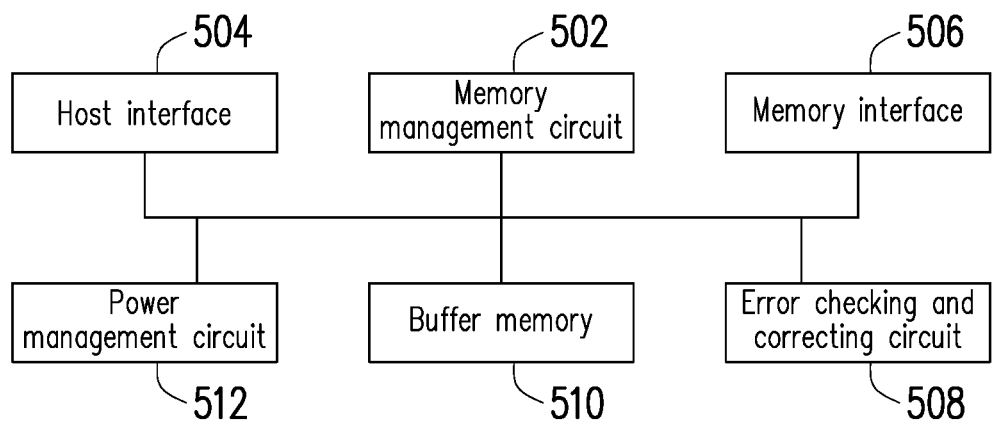
FIG. 5 is a schematic block diagram illustrating a memory controlling circuit unit according to an exemplary embodiment of the invention.

FIG. 5 is a schematic block diagram illustrating a memory controlling circuit unit according to an exemplary embodiment of the invention.

Referring to FIG. 5, the memory control circuit unit 404 includes a memory management circuit 502, a host interface 504 and a memory interface 506.

The memory management circuit 502 is configured to control overall operation of the memory control circuit unit 404. Specifically, the memory management circuit 502 has a plurality of control commands. When the memory storage apparatus 10 operates, the control commands are executed to perform various operations such as data writing, data reading and data erasing.

In this exemplary embodiment, the control commands of the memory management circuit 502 are implemented in a firmware form. For instance, the memory management circuit 502 has a microprocessor unit (not illustrated) and a ROM (not illustrated), and the control commands are burned into the ROM. During operation of the memory storage apparatus 10, the control commands are executed by the microprocessor to perform operations of writing, reading or erasing data.

In another exemplary embodiment of the invention, the control commands of the memory management circuit 502 may also be stored as program codes in a specific area (e.g., the system area in a memory exclusively used for storing system data) of the rewritable non-volatile memory module 406. In addition, the memory management circuit 502 has a microprocessor unit (not illustrated), a ROM (not illustrated) and a RAM (not illustrated). In particular, the ROM has a boot code, which is executed by the microprocessor unit to load the control commands stored in the rewritable non-volatile memory module 406 to the RAM of the memory management circuit 502 when the memory control circuit unit 404 is enabled. Later, the control commands are executed by the microprocessor unit to perform operations of writing, reading or erasing data.

Further, in another exemplary embodiment of the invention, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 406; The memory writing circuit is configured to send a write command for the rewritable non-volatile memory module 406 to write data into the rewritable non-volatile memory module 406; the memory reading circuit is configured to send a read command to the rewritable non-volatile memory module 406 in order to read data from the rewritable non-volatile memory module 406; the memory erasing circuit is configured to send an erase command to the rewritable non-volatile memory module 406 in order to erase data from the rewritable non-volatile memory module 406; and the data processing circuit is configured to process both the data to be written into the rewritable non-volatile memory module 406 and the data read from the rewritable non-volatile memory module 406.

The host interface 504 is coupled to the memory management circuit 502 and configured to couple to the connection interface unit 402, so as to receive and identify the commands and the data sent from the host system 11. In other words, the commands and data transmitted by the host system 11 are transmitted to the memory management circuit 502 via the host interface 504. In this exemplary embodiment, the host interface 504 is compatible with the SATA standard. However, it should be understood that the present invention is not limited thereto, and the host interface 504 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506.

The buffer memory 508 is coupled to the memory management circuit 502 and configured to temporarily store data and commands from the host system 11 or data from the rewritable non-volatile memory module 406.

In an exemplary embodiment, the memory control circuit unit 404 further includes a buffer memory 508, a power management circuit 510 and an error checking and correcting circuit 512.

The power management unit 510 is coupled to the memory management circuit 502 and configured to control a power of the memory storage apparatus 10.

The error checking and correcting circuit 512 is coupled to the memory management circuit 502 and configured to execute an error checking and correcting procedure to ensure the data integrity. Specifically, when the memory management circuit 502 receives a write command from the host system 11, the error checking and correcting circuit 512 generates an error checking and correcting code (ECC code) for data corresponding to the write command, and the memory management circuit 502 writes data and the ECC code corresponding to the write command to the rewritable non-volatile memory module 406. Later, when reading the data from the rewritable non-volatile memory module 406, the memory management circuit 502 also reads the error checking and correcting code corresponding to the data, and the error checking and correcting circuit 512 executes the error checking and correcting procedure for the read data according to the error checking and correcting code.

In the following description, the operations performed by the memory management circuit 502, the host interface 504, the memory interface 506, the buffer memory 508, the power management circuit 510 and the error checking and correcting circuit 512 may also be referred to as being performed by the memory control circuit unit 404.

In an exemplary embodiment, the memory management circuit 502 temporarily stores first data in the buffer memory 508 and generates one error checking and correcting code (hereinafter, referred to as an error correcting code) based on the first data. The type of error correcting code may be a parity checking code, a channel coding, or other types. For example, the error correcting code generated by the memory management circuit 502 may be a hamming code, a low density parity code (LDPC code), a turbo code, a Reed-solomon code (RS code), a BCH code, or codes using other algorithms. The invention is not limited in this regard. If a length ratio between the data and the error correcting code is m:n, it means that m physical programming units storing the data will correspond to n physical programming units storing the error correcting codes, where m and n are positive integers. In general, the positive integer m is greater than the positive integer n, but the invention is not limited here. Moreover, values of the positive integer m and the positive integer n are not limited by the invention.

In an exemplary embodiment, the error correcting code includes an array error correcting code. The memory management circuit 502 temporarily stores the first data in the buffer memory 508, and generates the array error correcting code based on the first data. The array error correcting code is configured to correct the physical programming units storing the first data. For instances, the memory management circuit 502 generates the array error correcting code by performing logical operations on the data programmed in the different physical programming units. Therefore, the array error correcting code can correct the data in more than two of the physical programming units. The generated array error correcting code is also programmed into one physical programming unit. In this exemplary embodiment, the array error correcting code is generated by the memory management circuit 502. However, the array error correcting code may also be generated by the error checking and correcting circuit 512, and the invention is not limited thereto.

The memory management circuit 502 can manage and access the physical nodes in the rewritable non-volatile memory module 406 based on a management unit. One management unit is also known as a virtual block (VB). One management unit can contain a plurality of physical nodes. For example, one management unit can cover the physical nodes belonging to one or more planes (a.k.a. memory planes) and/or one or more chip enables (CE) in the rewritable non-volatile memory module 406.

Figure 6:
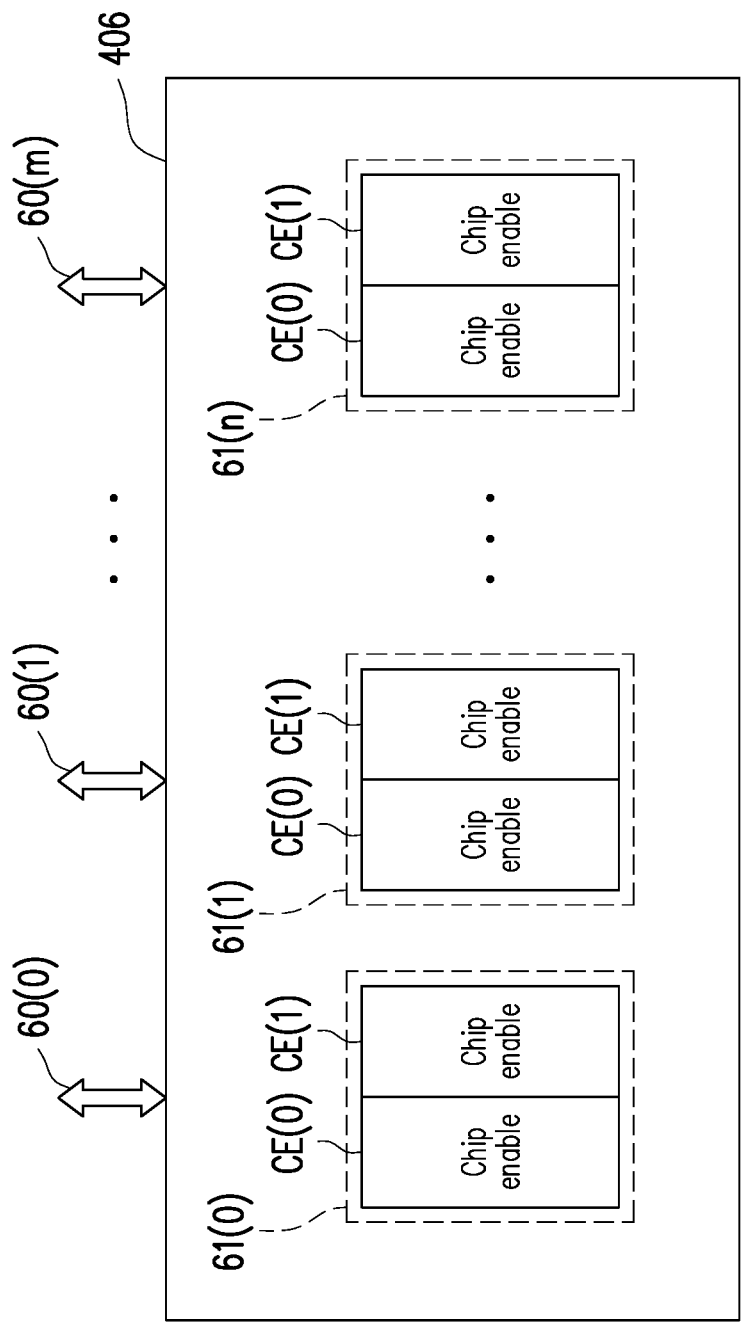
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention. Referring to FIG. 6, the rewritable non-volatile memory module 406 includes management units 61(0) to 61(n). Each of the management units 61(0) to 61(n) contains chip enables (a.k.a. chip enable groups) CE(0) and CE(1). Each of the chip enables CE(0) and CE(1) contains a plurality of physical nodes. The memory management circuit 502 can enable the chip enables respectively through chip enable pins. The memory management circuit 502 can access the management units 61(0) to 61(n) through channels 60(0) to 60(m). For example, the memory management circuit 502 can access the management units 61(0) and 61(1) in parallel (or interleavedly) through at least two channels of the channels 60(0) to 60(m). In addition, each of the chip enables CE(0) and CE(1) may include a plurality of planes (e.g., first planes PL(1), PL(3), PL(5) and PL(7) and second planes PL(2), PL(4), PL(6) and PL(8) in FIG. 7).

The planes in the management units 61(0) and 61(1) may include a plurality of physical nodes. These physical nodes may be accessed in parallel (or interleavedly) to improve an access efficiency. In an exemplary embodiment, a plurality of consecutive physical nodes in one plane may be referred to as one physical programming unit. Alternatively, in an exemplary embodiment, a plurality of consecutive physical nodes in one chip enable may be referred to as one physical programming unit. Alternatively, in an exemplary embodiment, a plurality of consecutive physical nodes in multiple planes may be referred to as one physical programming unit.

The memory management circuit 502 combines multiple physical erasing units belonging to different memory planes into one super physical unit (a.k.a. a super physical erasing unit) before operations (e.g., a data writing operation, or a data erasing operation) are performed, The super physical unit will include at least two available physical erasing units among all the physical erasing units. In this exemplary embodiment, the at least two available physical erasing units included by the super physical unit belong to different operation units (e.g., plane, interleave, or channel). Therefore, different physical programming units in super physical programming units included by the super physical unit can be programmed simultaneously based on the same write command.

Figure 7:
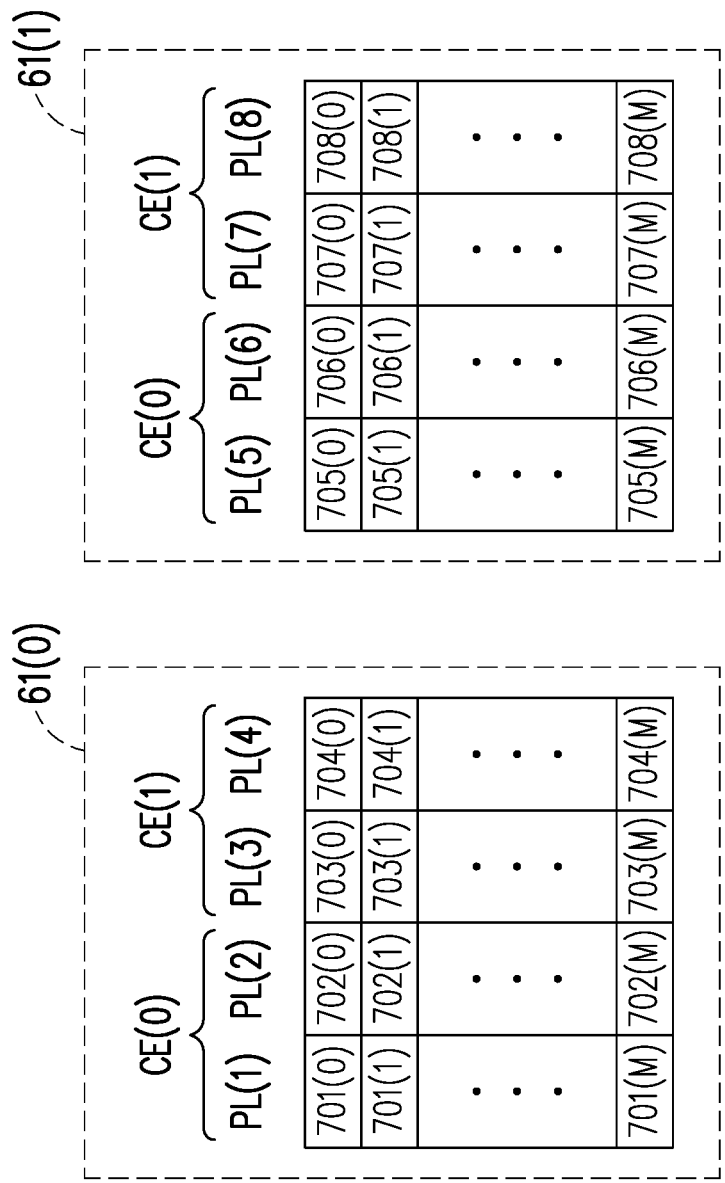
FIG. 7 is a schematic diagram illustrating a management unit according to an exemplary embodiment of the disclosure.

FIG. 7 is a schematic diagram illustrating a management unit according to an exemplary embodiment of the disclosure. Referring to FIG. 7, taking the management units 61(0) and 61(1) as an example, the first plane PL(1), PL(3), PL(5) and PL(7) and the second plane PL(2), PL(4), PL(6) and PL(8) can include multiple physical nodes. The management unit 61(0) includes the chip enables CE(0) and CE(1). The first planes PL(1) and PL(3) and the second planes PL(2) and PL(4) in the chip enables CE(0) and CE(1) include physical programming units 701(0) to 701(M), 703(0) to 703(M), 702(0) to 702(M) and 704(0) to 704(M), respectively. The management unit 61(1) includes the chip enables CE(0) and CE(1). The first planes PL(1) and PL(7) and the second planes PL(6) and PL(8) in the chip enables CE(0) and CE(5) include physical programming units 705(0) to 705(M), 707(0) to 707(M), 706(0) to 706(M) and 708(0) to 708(M), respectively. In this exemplary embodiment, the physical programming units 701(0) to 708(0), 701(1) to 708(1) and 701(M) to 708(M) may be configured as the super physical programming units, respectively.

In this exemplary embodiment, the memory management circuit 502 can write data into the physical programming units according to a programming sequence from the plane PL(1) to the plane PL(8). It is assumed that all the physical programming units are blank. For writing write data that can fill up to 16 physical programming units, the memory management circuit 502 will program the write data into the physical programming units from the first blank physical programming unit (e.g., the physical programming unit 701(0)) according to a programming sequence (e.g., program the written data into the physical programming units according to a programming sequence of the physical programming units 701(0), 702(0), 703(0), 704(0), 705(0), 706(0), 707(0), 708(0), 701(1), 702(1), 703(1), 704(1), 705(1), 706(1), 707(1) and 708(1)), and so on and so forth. In another embodiment, the memory management circuit 502 can program the data into one (or more) management unit. For example, the data may be programmed into the physical programming units according to a programming sequence from the plane PL(1) to the plane PL(4), but the invention is not limited thereto.

FIG. 8 and FIG. 9 are schematic diagrams for writing an array error correcting code according to an exemplary embodiment of the invention. For simplification, reference numerals of the physical programming units are not all directly illustrated in the drawing. For each of the physical programming units where the data and the array error correcting code are stored in FIG. 8 and FIG. 9, reference can be made with reference numerals of the physical programming units in FIG. 7 and the physical programming units on the left sides of FIG. 8 and FIG. 9.

In the exemplary embodiment of FIG. 8, the length ratio between the data and the array error correcting code is 16:1 (i.e., the positive integer m is 16, and the positive integer n is 1). It is assumed here that the array error correcting code has a size of one physical programming unit. The memory management circuit 502 programs a first group including a first array error correcting code into a first chip enable group by using a first programming mode. The first group includes the first data and the first array error correcting code. Referring to FIG. 8, the memory management circuit 502 generates an array error correcting code 811 (a.k.a. a first partial array error correcting code) based on first partial data 810(1) to 810(16) in the first data 810(1) to 810(16) and 820(1) to 820(16). After generating the array error correcting code 811, the memory management circuit 502 temporarily stores the array error correcting code 811 in the buffer memory 508 of the memory control circuit unit 404. After generating an array error correcting code 812 (a.k.a. a second partial array error correcting code) based on second partial data 820(1) to 820(16), the memory management circuit 502 respectively programs the array error correcting code 811 and the array error correcting code 812 (collectively known as the first array error correcting code) into the physical programming unit 701(4) and the physical programming unit 702(4) of the different planes in sequence. Further, the memory management circuit 502 programs a second group including a second array error correcting code into a second chip enable group by using a second programming mode. The second group includes the second data and the second array error correcting code. Similarly, the memory management circuit 502 generates an array error correcting code 821 (a.k.a. a third partial array error correcting code) based on third partial data in the second data 830(1) to 830(16) and 840(1) to 840(16). After generating the array error correcting code 821, the memory management circuit 502 temporarily stores the array error correcting code 821 in the buffer memory 508 in the memory control circuit unit 404. After generating an array error correcting code 822 (a.k.a. a fourth partial array error correcting code) based on fourth partial data 840(1) to 840(16), the memory management circuit 502 respectively programs the array error correcting code 821 and the array error correcting code 822 (collectively known as the second array error correcting code) into the physical programming unit 703(8) and the physical programming unit 704(8) of the different planes in sequence, and so on and so forth. Accordingly, in the second programming mode, the memory management circuit 502 programs the second array error correcting code into the second chip enable group different from the first chip enable group. In other words, the memory management circuit 502 programs a group of the array error correcting code 811 and the array error correcting code 812 into the first plane PL(1) and the second PL(2) of the same chip enable, programs another group of the array error correcting code 821 and the array error correcting code 822 into the first plane PL(3) and the second PL(4) of another chip enable, and so on and so forth. That is, a plurality of partial array error correcting codes included by the array error correcting code can be evenly distributed in pairs among the different chip enables. When intending to read the data stored in the management units 61(0) and 61(1), the memory management circuit 502 can use a multi-plane method to read the data stored in each of the chip enables CE(0) and CE(1) in the management units 61(0) and 61(1). In this way, the chance of using a one-plane method to read the data can be reduced. In general, the memory management circuit 502 regards the array error correcting code as invalid data when reading data and does not read the physical programming unit storing the array error correcting code. Therefore, when the partial array error correcting codes included by the array error correcting code are not stored in two planes of the same chip enable in pairs, each of the partial array error correcting codes may be stored together with valid data in two planes of the same chip enable in pairs, so that the memory management circuit 502 needs to read the valid data by using the single-plane method, which affects the reading performance. Through the above operation of distributing the array error correcting codes, the present exemplary embodiment can evenly distribute the array error correcting codes in the first plane and the second plane of each chip enable. Accordingly, the memory management circuit 502 can evenly read the data stored in each chip enable, thereby improving the data reading efficiency.

In another embodiment, the first partial array error correcting code and the second partial array error correcting code can also be programmed unpaired to the different planes (e.g., the first plane PL(1) and the second plane PL(2)) of the first chip enable. Similarly, the third partial array error correcting code and the fourth partial array error correcting code can also be programmed unpaired to the different planes of the second chip enable. In this way, the goal of evenly distributing the array error correcting codes in the different chip enables can also be achieved.

In this exemplary embodiment, the array error correcting code 811 is the parity checking code. In other exemplary embodiments, the array error correcting code 811 may also be BCH or other types of error correcting codes. When an error occurs in one of the physical programming units storing the first partial data 810(1) to 810(16), the memory management circuit 502 corrects the physical programming unit that generates the error based on a parity correction algorithm. Other array error correcting codes can also correct the corresponding data based on the parity correction algorithm.

In an exemplary embodiment, before being programmed into the physical programming units 701(0) to 708(0) and 701(1) to 708(1), the first partial data 810(1) to 810(16) is stored in the buffer memory 508. Before the first partial data 810(1) is to be programmed to the physical programming unit 701(0), the memory management circuit 502 generates a temporary array error correcting code based on the first partial data 810(1). Next, the memory management circuit 502 programs the first partial data 810(1) into the physical programming unit 701(0), and generates another temporary array error correcting code based on the temporary array error correcting code and the first partial data 810(2). Similarly, after the first partial data 810(2) is written, said another temporary array error correcting code and the first partial data 810(3) can be used to generate yet another temporary array error correcting code, and so on and so forth. In other words, each time when writing one first partial data, the memory management circuit 502 generates the temporary array error correcting code corresponding to that first partial data. After writing all the first data 810(1) to 810(16), the temporary array error correcting code will become the array error correcting code 811. The memory management circuit 502 stores the temporary array error correcting code in the buffer memory 508. However, in another exemplary embodiment, the memory management circuit 502 can also generate the array error correcting code 811 based on the first partial data 810(1) to 810(16) at one time (e.g., the array error correcting code 811 may be generated before or after the first partial data 810(1) to 810(16) are written). The invention is not limited in this regard. In this exemplary embodiment, the memory management circuit 502 can generate the array error correcting code 821 based on the second partial data 820(1) to 820(16) in the same manner as described above, which will not be repeated here.

In an exemplary embodiment, the first partial data 810(1) to 810(16) are received from the host system 11. However, the host system 11 may write data of more than 16 physical programming units or less than 16 physical programming units at one time. In other words, the first partial data 810(1) to 810(16) may correspond to one or more write commands. For example, the host system 11 first issues one write command for writing data of 12 physical programming units. After receiving the data, the memory management circuit 502 does not immediately generate the array error correcting code 811. Next, the host system 11 issues another write command for writing data of 4 physical programming units. The memory management circuit 502 obtains the first partial data 810(1) to 810(16) from the data corresponding to the two write commands. For example, the memory management circuit 502 obtains the first partial data 810(1) to 810(12) from the first write command, and obtains the first partial data 810(13) to 810(16) from the second write command. The data in the second write command not yet written will be merged with the data in another write command. In this way, the first partial data 810(1) to 810(16) can correspond to two write commands. Nonetheless, the first partial data 810(1) to 810(16) can also correspond to three or more write commands. The invention is not limited in this regard. Alternatively, if the first write command is for writing data of 17 physical programming units, the memory management circuit 502 will obtain the first partial data 810(1) to 810(16) from these data. The data of the remaining 1 physical programming unit will be merged with other data (e.g., data of 15 physical programming units in the next write data). That is, the first partial data 810(1) to 810(16) may correspond to one write command. Similarly, the second partial data 820(1) to 820(16) may also correspond to one or more write commands. The invention is not limited in this regard.

In the exemplary embodiment of FIG. 9, the memory management circuit 502 only programs the data into the physical programming units in the first programming mode. In the second programming mode, the memory management circuit 502 programs the data and the array error correcting code into the physical programming units. The array error correcting codes are programmed into the physical programming units of different chip enable groups. Specifically, after generating the array error correcting codes 811 to 841, the memory management circuit 502 temporarily stores the array error correcting codes 811 to 841 in the buffer memory 508 of the memory control circuit unit 404. After generating the array error correcting code 842, the memory management circuit 502 respectively writes all the array error correcting codes 811 to 842 into physical programming units 701(N) to 708(N) of the different planes in sequence. In other exemplary embodiments, the memory management circuit 502 can temporarily store different numbers of array error correcting codes in the buffer memory 508 of the memory control circuit unit 404, and after generating two, four, eight, or other even number of array error correcting codes, respectively write all the generated array error correcting codes into the first plane and the second plane of the chip enables in sequence. Here, the partial array error correcting codes included in the array error correcting code can be evenly distributed in pairs among the planes of the different chip enables. In other embodiments, the partial array error correcting codes included in the array error correcting code can also be programmed unpaired into the planes of the different chip enables. The invention is not limited in this regard.

FIG. 10 is a schematic diagram for writing an array error correcting code according to an exemplary embodiment of the invention. In this embodiment, as an example for description, a first array error correcting code is generated based on first data, and a second array error correcting code is generated based on second data. In this exemplary embodiment, the memory management circuit 502 programs a first group including the first array error correcting code into a first chip enable group by using a first programming mode. The memory management circuit 502 programs a second group including the second array error correcting code into a second chip enable group by using a second programming mode. The first group includes the first data and the first array error correcting code, and the second group includes the second data and the second array error correcting code.

Referring to FIG. 10, the physical programming unit 701(0) and the physical erasing unit 708(0) are combined into a super physical unit, and the rest may be deduced by analogy. The memory management circuit 502 programs the first array error correcting code into the physical programming units of the super physical programming unit based on a first programming sequence in the first programming mode. Specifically, the memory management circuit 502 generates an array error correcting code 810 based on the first data 810(1) to 810(32), and programs the array error correcting code 810 into a physical programming unit 701 (4) of the physical programming units 701(4) to 708(4) (a.k.a. a first super physical programming unit) based on the first programming sequence in the first programming mode. The first programming sequence is, for example, a sequential programming from the first plane PL(1) to the second plane PL(8). Therefore, the physical programming unit 701(4) (a.k.a. a first physical programming unit) is a last physical programming unit programmed in the physical programming units 701(4) to 708(4). Further, the memory management circuit 502 generates an array error correcting code 820 based on the second data 820(1) to 820(32), and programs the array error correcting code 820 into a physical programming unit 708(7) of the physical programming units 701(8) to 708(8) (a.k.a. a second super physical programming unit) based on the second programming sequence in the second programming mode. The second programming sequence is, for example, a sequential programming from the second plane PL(8) to the first plane PL(1). Therefore, the physical programming unit 701(8) (a.k.a. a second physical programming unit) is a last physical programming unit programmed in the physical programming units 701(8) to 708(8). Here, the first programming sequence is different from the second programming sequence, and a relative position of the physical programming unit 701(4) in the physical programming units 701(4) to 708(8) is different from a relative position of the physical programming unit 708(8) in the physical programming units 701(8) to 708(8). This exemplary embodiment does not limit the programming sequences of the first data 810(1) to 810(32) and the second data 820(1) to 820(32). In this way, the array error correcting code 810 and the array error correcting code 820 can be programmed into the different chip enable groups due to the different programming sequences.

In an exemplary embodiment, a data volume of the first data for generating the first array error correcting code is different from a data volume of the second data for generating the second array error correcting code. Quantities of the physical programming units correctable by the first array error correcting code and the second array error correcting code are different. For instance, the data volume of the first data is a data volume that can be stored by 28 physical programming units, and the data volume of the second data is a data volume that can be stored by 32 physical programming units. The memory management circuit 502 sequentially programs the first data and the generated first array error correcting code into the physical programming units, and then sequentially programs the second data and the generated second array error correcting code into the physical programming units. Based on this, the first array error correcting code and the second array error correcting code can be programmed into the different chip enable groups due to the difference data volumes for generating the array error correcting codes.

In the foregoing embodiments, the memory management circuit 502 can generate an array error correcting code including a plurality of partial array error correcting codes based on the received data. The invention is not limited in this regard. In addition, the memory management circuit 502 can write the generated partial array error correcting codes into the consecutive physical programming units included by the super physical programming unit.

In the foregoing embodiments, the super physical erasing unit is a minimum data erasing management unit, and the super physical erasing unit includes multiple physical programming units. According to the data writing method provided by this exemplary embodiment, in an exemplary embodiment, numbers of groups of the array error correcting codes programmed into the chip enable groups included in the super physical erasing unit are identical. For example, referring to FIG. 7, the super physical erasing unit may include the chip enable CE(0) and CE(1), and the number of groups of the array error correcting code programmed into the chip enable group CE(0) is identical to the number of groups of the array error correcting code programmed into the chip enable group CE(1).

Compared with the array error correcting code, the error correcting code also includes a redundant error correcting code. In an exemplary embodiment, after writing one first data into one or more physical erasing units, the memory management circuit 502 generates a redundant error correcting code based on the first data. The redundant error correcting code is configured to correct a part of bits in a single physical programming unit written with at least part of the first data, A number of bits correctable by the redundant error correcting code is less than a number of bits correctable by the first array error correcting code. For instance, the redundant error correcting code is stored in the redundancy bit area and can only correct a part of bits of the data in the data bit area in the single physical programming unit. In this exemplary embodiment, the redundant error correcting code is generated by the memory management circuit 502. However, the redundant error correcting code may also be generated by the error checking and correcting circuit 512, and the invention is not limited thereto.

Figure 11:
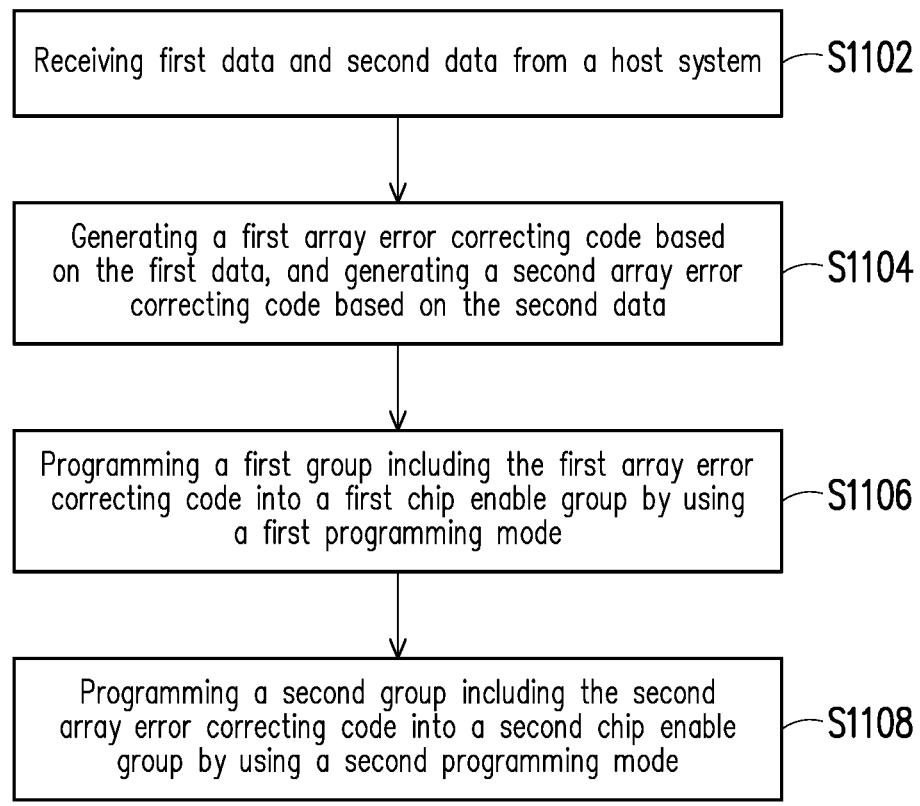
FIG. 11 is a flowchart of a data writing method according to an exemplary embodiment of the invention.

FIG. 11 is a flowchart of a data writing method according to an exemplary embodiment of the invention. Referring to FIG. 11, in step S1102, first data and second data are received from a host system. In step S1104, a first array error correcting code is generated based on the first data, and a second array error correcting code is generated based on the second data. In step S1106, a first group including the first array error correcting code is programmed into the first chip enable group by using a first programming mode. In step S1108, a second group including the second array error correcting code is programmed into the second chip enable group by using a second programming mode.

Figure 12:
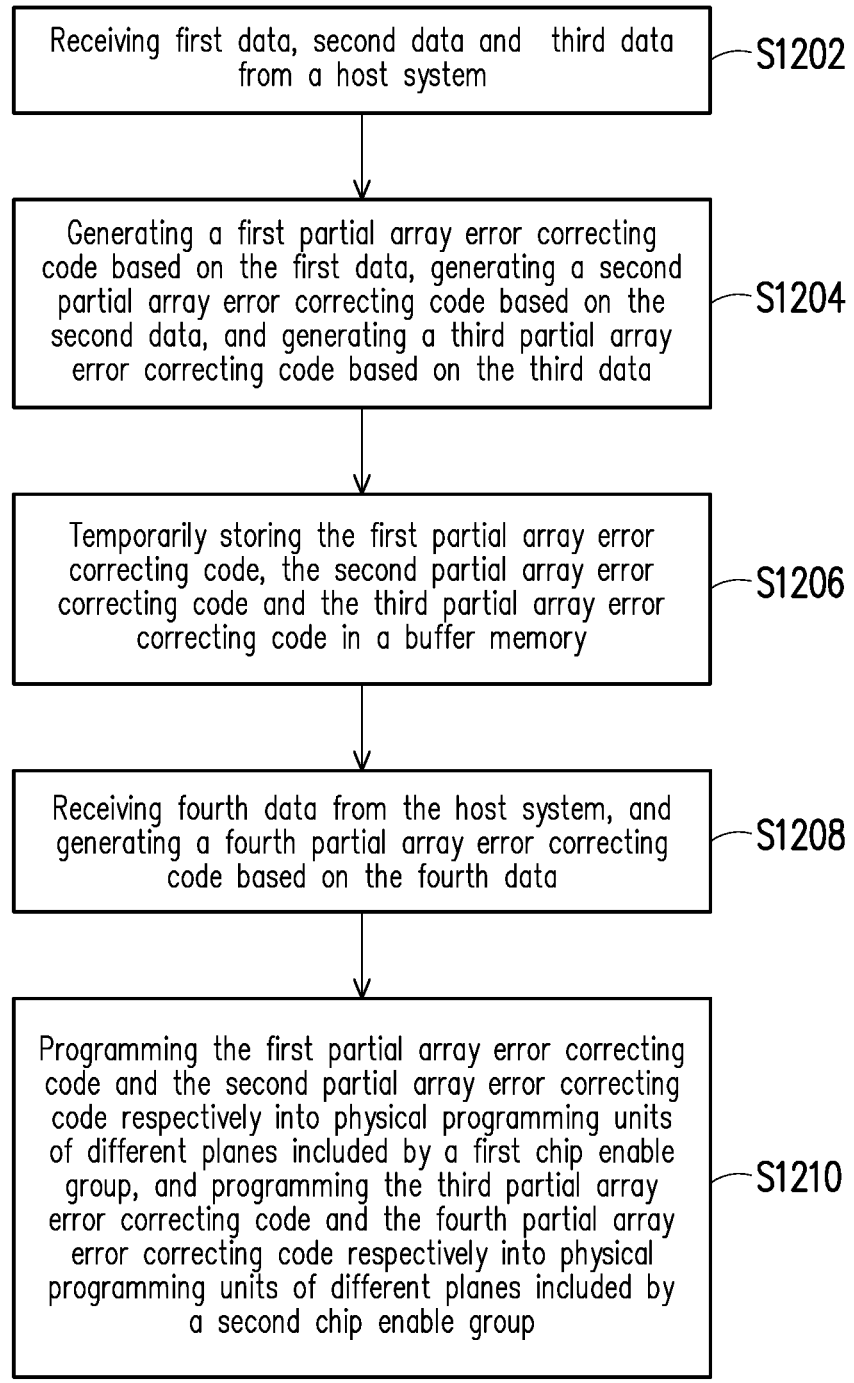
FIG. 12 is a flowchart of a data writing method according to an exemplary embodiment of the invention.

FIG. 12 is a flowchart of a data writing method according to an exemplary embodiment of the invention. Referring to FIG. 12, in step S1202, first data, second data and third data are received from a host system. In step S1204, a first partial array error correcting code is generated based on the first data, a second partial array error correcting code is generated based on the second data, and a third partial array error correcting code is generated based on the third data. In step S1206, the first partial array error correcting code, the second partial array error correcting code and the third partial array error correcting code are temporarily stored in a buffer memory. In step S1208, fourth data is received from the host system, and a fourth partial array error correcting code is generated based on the fourth data. In step S1210, the first partial array error correcting code and the second partial array error correcting code are respectively written into a plurality of physical programming units of different planes included by a first chip enable group, and the third partial array error correcting code and the fourth partial array error correcting code are respectively written into a plurality of physical programming units of different planes included by a second chip enable group.

Steps depicted in FIG. 11 and FIG. 12 are described in detail as above, thus it is omitted hereinafter. Nevertheless, the steps depicted in FIG. 11 and FIG. 12 may be implemented as a plurality of program codes or circuits, and the invention is not limited thereto. In addition, the methods disclosed in FIG. 11 and FIG. 12 can be used in conjunction with the above exemplary embodiments, or can be used alone, and the invention is not limited thereto.

In particular, the data writing method proposed by the exemplary embodiments of the invention can make the number of array error correcting codes included in each chip enabling group as the same as possible. In another exemplary embodiment, the number of array error correcting codes included in each plane can also be made as the same as possible. Accordingly, the array error correcting codes can be evenly distributed among the chip enables.

In summary, the data writing method, the memory control circuit unit, and the memory storage apparatus proposed by the exemplary embodiments of the invention can be used to evenly distribute the array error correcting codes among the different chip enables. Accordingly, the memory can read the data stored in the chip enables evenly when reading data, thereby improving the data reading efficiency. In other embodiments, by further storing the array error correcting codes on the different planes of the same chip enable, the memory can reduce the chance of using the single plane method to read the data, and read the data stored in the chip enables evenly when reading data, thereby improving the data reading efficiency.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the present invention.

It will be apparent to those skilled in the art that various modifications and variations can be made to the structure of the invention without departing from the scope or spirit of the invention. In view of the foregoing, it is intended that the present invention cover modifications and variations of this invention provided they fall within the scope of the following claims and their equivalents.

What is claimed is:

1. A data writing method for a rewritable non-volatile memory module, wherein the rewritable non-volatile memory module comprises a plurality of management units, each of the plurality of management units comprises a plurality of chip enable groups, each of the plurality of chip enable groups comprises a plurality of planes, each of the plurality of planes comprises a plurality of physical programming units, the plurality of chip enable groups comprise a first chip enable group and a second chip enable group, and the data writing method comprises:
receiving first data and second data from a host system;
generating a first array error correcting code based on the first data, and generating a second array error correcting code based on the second data;
programming a first group including the first array error correcting code into the first chip enable group by using a first programming mode; and
programming a second group including the second array error correcting code into the second chip enable group by using a second programming mode, the second programming mode being different from the first programming mode,
wherein the first array error correcting code and the second array error correcting code are configured to correct the plurality of physical programming units storing the first data and the second data, respectively.

2. The data writing method of claim 1, wherein a data volume of the first data is different from a data volume of the second data, and quantities of the plurality of physical programming units correctable by the first array error correcting code and the second array error correcting code are different.

3. The data writing method of claim 1, wherein programming the first array error correcting code into a first super physical programming unit based on a first programming sequence in the first programming mode, and
programming the second array error correcting code into a second super physical programming unit based on a second programming sequence in the second programming mode,
wherein the first programming sequence is different from the second programming sequence.

4. The data writing method of claim 3, wherein the first super physical programming unit has the physical programming units in which a first physical programming unit is a last physical programming unit programmed in the first super physical programming unit,
wherein the second super physical programming unit has the physical programming units in which a second physical programming unit is a last physical programming unit programmed in the second super physical programming unit, and a relative position of the first physical programming unit in the first super physical programming unit is different from a relative position of the second physical programming unit in the second super physical programming unit.

5. The data writing method of claim 1, wherein a super physical erasing unit comprises the first chip enable group and the second chip enable group, wherein a number of groups of the first array error correcting code programmed into the first chip enable group is identical to a number of groups of the second array error correcting code programmed into the second chip enable group, wherein the super physical erasing unit is a minimum data erasing management unit.

6. The data writing method of claim 1, wherein the first array error correcting code comprises a first partial array error correcting code and a second partial array error correcting code.

7. The data transfer method of claim 6, further comprising:
temporarily storing the first partial array error correcting code in a buffer memory; and
after generating the second partial array error correcting code based on the first data, programming the first partial array error correcting code and the second partial array error correcting code respectively into the plurality of physical programming units of the different planes included by the first chip enable group.

8. The data writing method of claim 1, wherein the first array error correcting code and the second array error correcting code are parity checking codes, the first array error correcting code is configured to, when at least one of the physical programming units storing the first data generates an error, correct the physical programming unit that generates the error based on a parity correction algorithm, and the second array error correcting code is configured to, when at least one of the physical programming units storing the second data generates the error, correct the physical programming unit that generates the error based on the parity correction algorithm.

9. The data transfer method of claim 1, further comprising:
generating a redundant error correcting code based on the first data, the redundant error correcting code being configured to correct a single physical programming unit written with at least part of the first data,
wherein a number of bits correctable by the redundant error correcting code is less than a number of bits correctable by the first array error correcting code.

10. A memory control circuit unit for a rewritable non-volatile memory module, wherein the rewritable non-volatile memory module comprises a plurality of management units, each of the plurality of management units comprises a plurality of chip enable groups, each of the plurality of chip enable groups comprises a plurality of planes, each of the plurality of planes comprises a plurality of physical programming units, the plurality of chip enable groups comprise a first chip enable group and a second chip enable group, wherein the memory control circuit unit comprises:
a host interface, configured to couple to a host system,
a memory interface, configured to couple to the rewritable non-volatile memory module; and
a memory management circuit, coupled to the host interface and the memory interface;
wherein the memory management circuit is configured to receive first data and second data,
the memory management circuit is further configured to generate a first array error correcting code based on the first data, and generate a second array error correcting code based on the second data,
the memory management circuit is further configured to program a first group including the first array error correcting code into the first chip enable group by using a first programming mode, and
the memory management circuit is further configured to program a second group including the second array error correcting code into the second chip enable group by using a second programming mode, the second programming mode being different from the first programming mode,
wherein the first array error correcting code and the second array error correcting code are configured to correct the plurality of physical programming units storing the first data and the second data, respectively.

11. The memory control circuit unit of claim 10, wherein a data volume of the first data is different from a data volume of the second data, and quantities of the plurality of physical programming units correctable by the first array error correcting code and the second array error correcting code are different.

12. The memory control circuit unit of claim 10, wherein the memory management circuit is further configured to program the first array error correcting code into a first super physical programming unit based on a first programming sequence in the first programming mode, and
the memory management circuit is further configured to program the second array error correcting code into a second super physical programming unit based on a second programming sequence in the second programming mode,
wherein the first programming sequence is different from the second programming sequence.

13. The memory control circuit unit of claim 12, wherein the first super physical programming unit has the physical programming units in which a first physical programming unit is a last physical programming unit programmed in the first super physical programming unit,
wherein the second super physical programming unit has the physical programming units in which a second physical programming unit is a last physical programming unit programmed in the second super physical programming unit, and a relative position of the first physical programming unit in the first super physical programming unit is different from a relative position of the second physical programming unit in the second super physical programming unit.

14. The memory control circuit unit of claim 10, wherein a super physical erasing unit comprises the first chip enable group and the second chip enable group, wherein a number of groups of the first array error correcting code programmed into the first chip enable group is identical to a number of groups of the second array error correcting code programmed into the second chip enable group, wherein the super physical erasing unit is a minimum data erasing management unit.

15. The memory control circuit unit of claim 10, wherein the first array error correcting code comprises a first partial array error correcting code and a second partial array error correcting code.

16. The memory control circuit unit of claim 15, wherein the memory management circuit is further configured to temporarily store the first partial array error correcting code in a buffer memory, and
after generating the second partial array error correcting code based on the first data, the memory management circuit is further configured to program the first partial array error correcting code and the second partial array error correcting code respectively into the plurality of physical programming units of the different planes included by the first chip enable group.

17. The memory control circuit unit of claim 10, wherein the first array error correcting code and the second array error correcting code are parity checking codes, the first array error correcting code is configured to, when at least one of the physical programming units storing the first data generates an error, correct the physical programming unit that generates the error based on a parity correction algorithm, and the second array error correcting code is configured to, when at least one of the physical programming units storing the second data generates the error, correct the physical programming unit that generates the error based on the parity correction algorithm.

18. The memory control circuit unit of claim 10, wherein the memory management circuit is further configured to generate a redundant error correcting code based on the first data, and the redundant error correcting code is configured to correct a single physical programming unit written with at least part of the first data, wherein a number of bits correctable by the redundant error correcting code is less than a number of bits correctable by the first array error correcting code.

19. A memory storage apparatus, comprising:

a connection interface unit configured to couple to a host system;

a rewritable non-volatile memory module, wherein the rewritable non-volatile memory module comprises a plurality of management units, each of the plurality of management units comprises a plurality of chip enable groups, each of the plurality of chip enable groups comprises a plurality of planes, each of the plurality of planes comprises a plurality of physical programming units, the plurality of chip enable groups comprise a first chip enable group and a second chip enable group; and a memory controlling circuit unit, coupled to the connection interface unit and the rewritable non-volatile memory module, wherein the memory control circuit unit is configured to receive first data and second data, the memory control circuit unit is further configured to generate a first array error correcting code based on the first data, and generate a second array error correcting code based on the second data, the memory control circuit unit is further configured to program a first group including the first array error correcting code into the first chip enable group by using a first programming mode, and the memory control circuit unit is further configured to program a second group including the second array error correcting code into the second chip enable group by using a second programming mode, the second programming mode being different from the first programming mode, wherein the first array error correcting code and the second array error correcting code are configured to correct the plurality of physical programming units storing the first data and the second data, respectively.

20. The memory storage apparatus of claim 19, wherein a data volume of the first data is different from a data volume of the second data, and quantities of the plurality of physical programming units correctable by the first array error correcting code and the second array error correcting code are different.

21. The memory storage apparatus of claim 19, wherein the memory control circuit unit is further configured to program the first array error correcting code into a first super physical programming unit based on a first programming sequence in the first programming mode, and the memory control circuit unit is further configured to program the second array error correcting code into a second super physical programming unit based on a second programming sequence in the second programming mode, wherein the first programming sequence is different from the second programming sequence.

22. The memory storage apparatus of claim 21, wherein the first super physical programming unit has the physical programming units in which a first physical programming unit is a last physical programming unit programmed in the first super physical programming unit, wherein the second super physical programming unit has the physical programming units in which a second physical programming unit is a last physical programming unit programmed in the second super physical programming unit, and a relative position of the first physical programming unit in the first super physical programming unit is different from a relative position of the second physical programming unit in the second super physical programming unit.

23. The memory storage apparatus of claim 19, wherein a super physical erasing unit comprises the first chip enable group and the second chip enable group, wherein a number of groups of the first array error correcting code programmed into the first chip enable group is identical to a number of groups of the second array error correcting code programmed into the second chip enable group, wherein the super physical erasing unit is a minimum data erasing management unit.

24. The memory storage apparatus of claim 19, wherein the first array error correcting code comprises a first partial array error correcting code and a second partial array error correcting code.

25. The memory storage apparatus of claim 24, wherein the memory control circuit unit is further configured to temporarily store the first partial array error correcting code in a buffer memory, and after generating the second partial array error correcting code based on the first data, the memory control circuit unit is further configured to program the first partial array error correcting code and the second partial array error correcting code respectively into the plurality of physical programming units of the different planes included by the first chip enable group.

26. The memory storage apparatus of claim 19, wherein the first array error correcting code and the second array error correcting code are parity checking codes, the first array error correcting code is configured to, when at least one of the physical programming units storing the first data generates an error, correct the physical programming unit that generates the error based on a parity correction algorithm, and the second array error correcting code is configured to, when at least one of the physical programming units storing the second data generates the error, correct the physical programming unit that generates the error based on the parity correction algorithm.

27. The memory storage apparatus of claim 19, wherein the memory control circuit unit is further configured to generate a redundant error correcting code based on the first data, and the redundant error correcting code is configured to correct one of the physical programming units written with at least part of the first data, wherein a number of bits correctable by the redundant error correcting code is less than a number of bits correctable by the first array error correcting code.

* * * * *